United States Patent
Lee et al.

(10) Patent No.: US 9,418,892 B2
(45) Date of Patent: Aug. 16, 2016

(54) TRANSISTOR, SEMICONDUCTOR DEVICE AND METHOD OF MANUFACTURING THE SAME

(71) Applicant: SK hynix Inc., Gyeonggi-do (KR)

(72) Inventors: Ki Hong Lee, Gyeonggi-do (KR); Jin Ho Bin, Seoul (KR); Soo Jin Kim, Seoul (KR); Seung Ho Pyi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/074,885

(22) Filed: Mar. 18, 2016

(65) Prior Publication Data

US 2016/0204025 A1    Jul. 14, 2016

Related U.S. Application Data

(63) Continuation of application No. 14/324,953, filed on Jul. 7, 2014, now Pat. No. 9,324,824.

(30) Foreign Application Priority Data

Feb. 14, 2014 (KR) ........................ 10-2014-0017372

(51) Int. Cl.
  *H01L 21/4763* (2006.01)
  *H01L 21/768* (2006.01)

(52) U.S. Cl.
  CPC .... *H01L 21/76847* (2013.01); *H01L 21/76879* (2013.01)

(58) Field of Classification Search
  CPC .................... H01L 21/76847; H01L 21/76879
  USPC ......................................................... 438/627
  See application file for complete search history.

(56) References Cited

U.S. PATENT DOCUMENTS

| | | | |
|---|---|---|---|
| 2012/0098049 A1* | 4/2012 | Moon ............... | H01L 27/11556 257/324 |
| 2012/0299076 A1* | 11/2012 | Yoo ................... | H01L 29/66833 257/314 |
| 2015/0076586 A1* | 3/2015 | Rabkin .............. | G11C 16/0483 257/324 |
| 2015/0187789 A1* | 7/2015 | Lee ................... | H01L 27/11582 257/326 |

\* cited by examiner

*Primary Examiner* — Thien F Tran
(74) *Attorney, Agent, or Firm* — IP & T Group LLP

(57) ABSTRACT

A semiconductor device including a central region, side regions located in both sides of the central region, and conductive layers including a first barrier pattern formed in the central region, a material pattern formed in the first barrier pattern and having an etch selectivity with respect to the first barrier pattern, and a second barrier pattern formed in the material pattern; and insulating layers alternately stacked with the conductive layers.

7 Claims, 16 Drawing Sheets

TRANSISTOR, SEMICONDUCTOR DEVICE AND METHOD OF MANUFACTURING THE SAME

CROSS-REFERENCE TO RELATED APPLICATION

This application is a continuation of U.S. patent application Ser. No. 14/324,953 filed on Jul. 7, 2014, which claims priority to Korean patent application number 10-2014-0017372, filed on Feb. 14, 2014. The entire disclosure of each of the foregoing applications is incorporated herein in its entirety by reference.

BACKGROUND

1. Field of Invention

Various exemplary embodiments of the present invention relate generally to a transistor, a semiconductor device and a method of manufacturing the same, and more particularly, to a transistor having a 3-dimensional structure, a semiconductor device and a method of manufacturing the same.

2. Description of Related Art

Nonvolatile memory devices are memory devices that retain stored data even when their power supplies are interrupted. Since the degree of integration of a 2-dimensional nonvolatile memory device configured to form a memory cell in a single-layer on a substrate has reached a limit, a 3-dimensional nonvolatile memory device that vertically stacks memory cells on the substrate has been proposed.

The 3-dimensional nonvolatile memory device includes interlayer insulating layers and gate electrodes, which are alternately stacked, channel layers passing there through, and memory cells stacked along the channel layers. During the manufacturing process of the 3-dimensional nonvolatile memory device, after alternately stacking a plurality of oxide layers and a plurality of nitride layers, the stacked gate electrodes are formed by replacing the plurality of nitride layers with a plurality of conductive layers.

However, there is a concern that the process of replacing the nitride layers with the conductive layers is quite difficult. Particularly, in the process of replacing the nitride layers with the conductive layers, reactive gases remain in stacked materials. The surrounding layers may be damaged by the remaining reactive gases, and thus the characteristics of the memory device may be degraded.

SUMMARY

Exemplary embodiments of the present invention are directed to a transistor, a semiconductor device and a method of manufacturing the same in which the characteristics of a memory device are enhanced.

According to an embodiment of the present invention, a semiconductor device includes: conductive layers each having a central region and side regions located in both sides of the central region, the conductive layers each including a first barrier pattern formed in the central region, a material pattern, which is formed in the first barrier pattern and has an etch selectivity with respect to the first barrier pattern, and a second barrier pattern formed in the material pattern; and insulating layers alternately stacked with the conductive layers.

Another embodiment of the present invention provides a transistor including: a channel layer; a gate electrode including a first barrier pattern surrounding a sidewall of the channel layer, a material pattern, which is formed in the first barrier pattern and has an etch selectivity with respect to the first barrier pattern and a second barrier pattern formed in the material pattern, wherein the gate electrode includes a conductive pattern formed only in a side region of one side with respect to the channel layer; and a dielectric layer interposed between the channel layer and the gate electrode.

Yet another embodiment of the present invention provides a method of manufacturing a semiconductor device including: alternately forming first material layers and second material layers; forming a slit passing through the first material layers and the second material layers; forming first openings by removing the first material layers through the slit; forming a first barrier layer in the first openings; forming a material layer having an etch selectivity with respect to the first barrier layer in the first openings in which the first barrier layer is formed; forming a second barrier layer in the first openings in which the material layer is formed; forming second openings by removing the first barrier layer, the material layer and the second barrier layer formed in side regions of the first openings through the slit; and forming conductive patterns in the second openings.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION

Figure 1A:
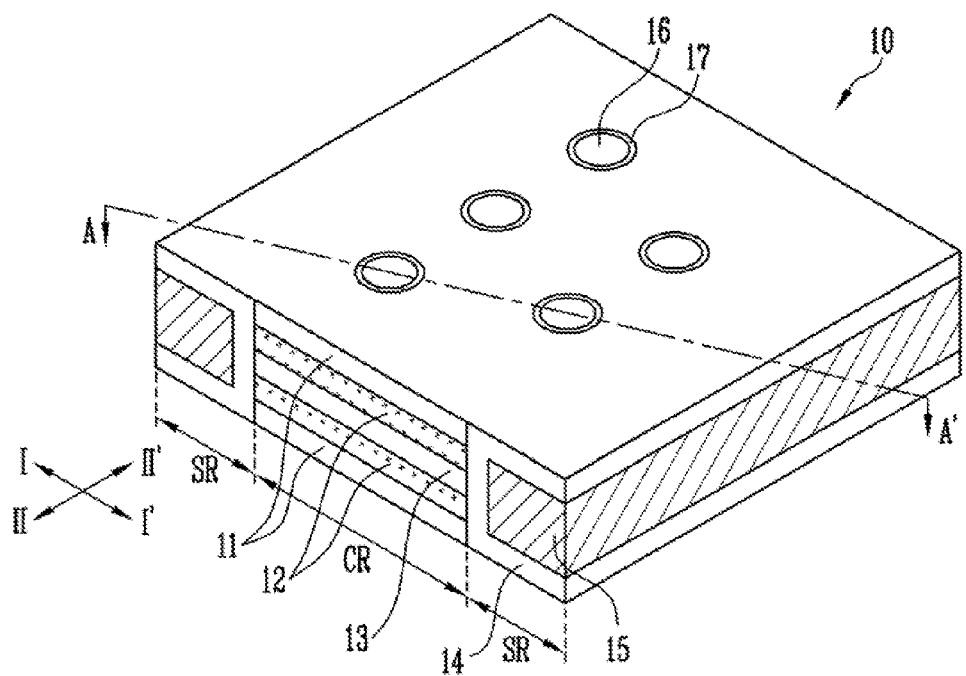
FIGS. 1A to 1C are views illustrating a structure of a semiconductor device according to an embodiment of the present invention.

Hereinafter, preferred embodiments of the present invention will be described. In the drawings, elements and regions are not drawn to scale, and their sizes and thicknesses may be exaggerated for clarity. In the description of the present invention, known configurations that are not central to the principles of the present invention may be omitted. Throughout the drawings and corresponding description, the same components are denoted by the same reference numerals.

In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Furthermore, 'connected/coupled' represents that one component is directly coupled to another component or indirectly coupled through another component. In this specification, a singular form may include a plural form as long as it is not specifically mentioned. Furthermore, 'include/comprise' or 'including/comprising' used in the specification represents that one or more components, steps, operations, and elements exist or are added.

Figure 1B:
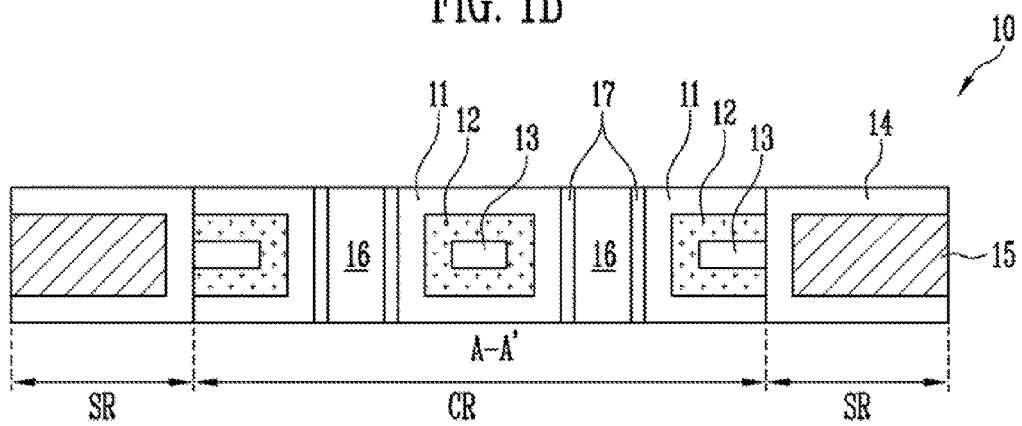
Figure 1C:
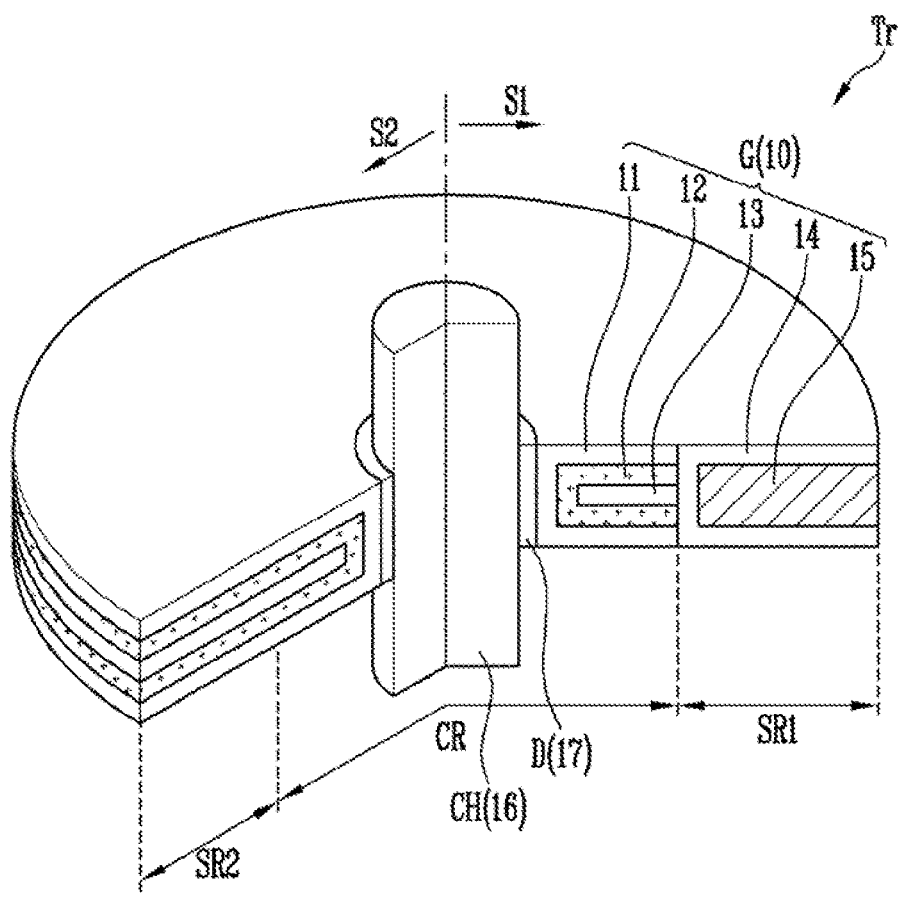

FIGS. 1A to 1C are views illustrating a structure of a semiconductor device according to an embodiment of the present invention. FIG. 1A is a perspective view of a conductive layer, FIG. 1B is a cross-sectional view taken along line A-A' of FIG. 1A, and FIG. 1C is a perspective view of a transistor.

As illustrated in FIG. 1A, a conductive layer 10 of the semiconductor device according to an embodiment of the present invention includes a first barrier pattern 11, a material pattern 12, a second barrier pattern 13, a third barrier pattern 14, and a conductive pattern 15.

The conductive layer 10 may include a central region CR and side regions SR defined at both sides of the central region CR. The conductive layer 10 may include the first barrier pattern 11 formed in the central region CR, the material pattern 12 formed in the first barrier pattern 11, and the second barrier pattern 13 formed in the material pattern 12. For example, the central region CR of the conductive layer 10 may have a structure in which the first barrier pattern 11, the material pattern 12, the second barrier pattern 13, the material pattern 12 and the first barrier pattern 11 are sequentially stacked.

The conductive layer 10 may further include the third barrier pattern 14 formed in the side region SR and the conductive pattern 15 formed in the third barrier pattern 14. For example, the third barrier pattern 14 is formed to surround the conductive pattern 15 in a 'C' shape.

The material pattern 12 is formed of a material having an etch selectivity with respect to the first barrier pattern 11, and may include a non-conductive material. For example, the material pattern 12 may include at least one of an oxide, a nitride, silicon oxide, silicon nitride, poly-silicon, germanium, silicon germanium, etc. The first, second and third barrier patterns 11, 13 and 14 may include a conductive material such as titanium (Ti), titanium nitride (TiN), tantalum (Ta), tantalum nitride (TaN), etc. Further, the conductive pattern 15 may include a metallic material such as tungsten (W), tungsten nitride ($WN_x$), etc.

In this drawing, one conductive layer 10 is illustrated. However, the semiconductor device may include a plurality of conductive layers, which are stacked, and a plurality of insulating layers that are interposed between the stacked conductive layers 10. For example, the conductive layers 10 may be stacked in a step shape so that pad portions are defined at ends thereof. Further, the conductive layer 10 may be a gate electrode of the transistor.

The semiconductor device according to the embodiment of the present invention may further include at least one semiconductor pattern 16 passing through the conductive layer 10. The semiconductor patterns 16 are arranged in a first direction I-I' and in a second direction II-II' crossing the first direction I-I', and the semiconductor patterns 16 arranged in the second direction II-II' constitute one column. In this case, the conductive layer 10 surrounds at least one column.

The semiconductor pattern 16 may pass through the central region CR of the conductive layer 10, or may pass through a boundary of the central region CR and the side region SR. Further, the semiconductor pattern 16 may have a hollow center, a solid center, or a combination thereof. The semiconductor pattern 16 may be a channel layer of a transistor.

The semiconductor device according to the embodiment of the present invention may further include a dielectric layer 17 interposed between the semiconductor pattern 16 and the conductive layer 10. The dielectric layer 17 may be a gate insulating layer of a select transistor, or a multi-layer dielectric layer of a memory cell transistor. For example, the multi-layer dielectric layer may include one or more of a tunnel insulating layer, a data storage layer, and a charge blocking layer. Further, the data storage layer may include a charge trap layer such as a nitride layer, etc., a poly-silicon, a phase change material, a nano-dot, etc.

For reference, although not shown in this drawing, an air gap may be formed in the second barrier pattern 13. Further, the third barrier pattern 14 may be omitted.

As illustrated in FIG. 1B, in the cross-section taken along line A-A', the first barrier pattern 11 is formed along a sidewall of the semiconductor pattern 16. Thus, the first barrier pattern 11 may have a 'C' shaped cross-section to surround the sidewall of the semiconductor pattern 16 and the material pattern 12. The material pattern 12 may be formed along an inner surface of the first barrier pattern 11, and may have a 'C' shaped cross-section. The second barrier pattern 13 may fill a groove of the material pattern 12, and may be interposed between the material pattern 12 and the third barrier pattern 14. For reference, the second barrier pattern 13 and the third barrier pattern 14 may be connected to each other as one integral layer. This will be described below with reference to FIGS. 7A and 7B.

As illustrated in FIG. 1C, a transistor Tr includes a channel layer CH, a gate electrode G surrounding a sidewall of the channel layer CH, and a dielectric layer D interposed between the channel layer CH and the gate electrode G. The channel layer CH may be the above-described semiconductor pattern 16, and the gate electrode G may be the above-described conductive layer 10, and the dielectric layer D may be the above-described dielectric layer 17.

The gate electrode G includes the first barrier pattern 11 surrounding a sidewall of the channel layer CH, the material pattern 12 formed in the first barrier pattern 11, and the second barrier pattern 13 formed in the material pattern 12. Further, the gate electrode G may include the third barrier pattern 14 formed in a side region SR1 of one side S1 with respect to the channel layer CH, and the conductive pattern 15 formed in the third barrier pattern 14. For example, the gate electrode G includes the third barrier pattern 14 and the conductive pattern 15 only in the side region SR1 of the one side S1, and includes the first barrier pattern 11, the material pattern 12, and the second barrier pattern 13 in all of the central region CR and a side region SR2 in the other side S2. Therefore, the gate electrode G may have an asymmetric structure, in which the one side S1 and the other side S2 with respect to the channel layer CH are different from each other.

Figure 2A:
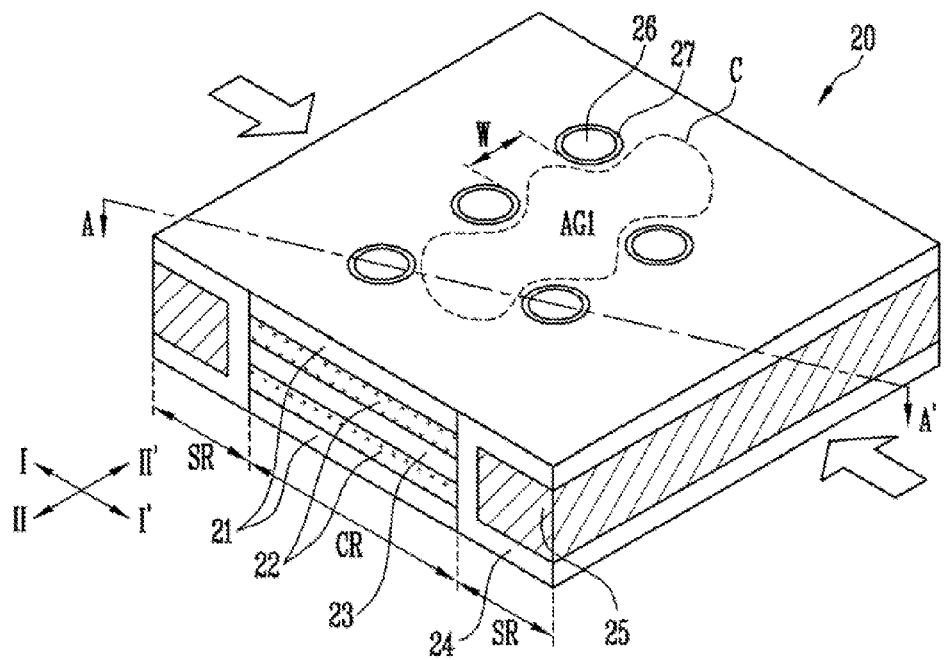
FIGS. 2A to 2C are views illustrating a structure of a semiconductor device according to an embodiment of the present invention.
Figure 2B:
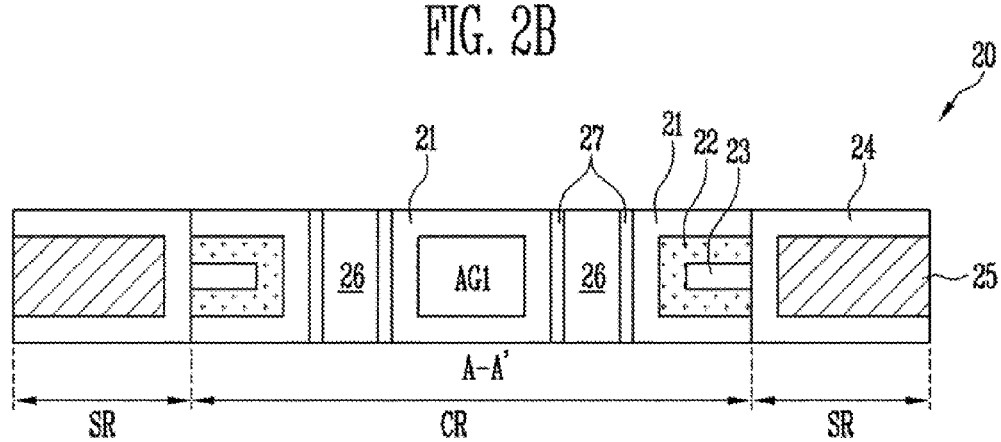
Figure 2C:
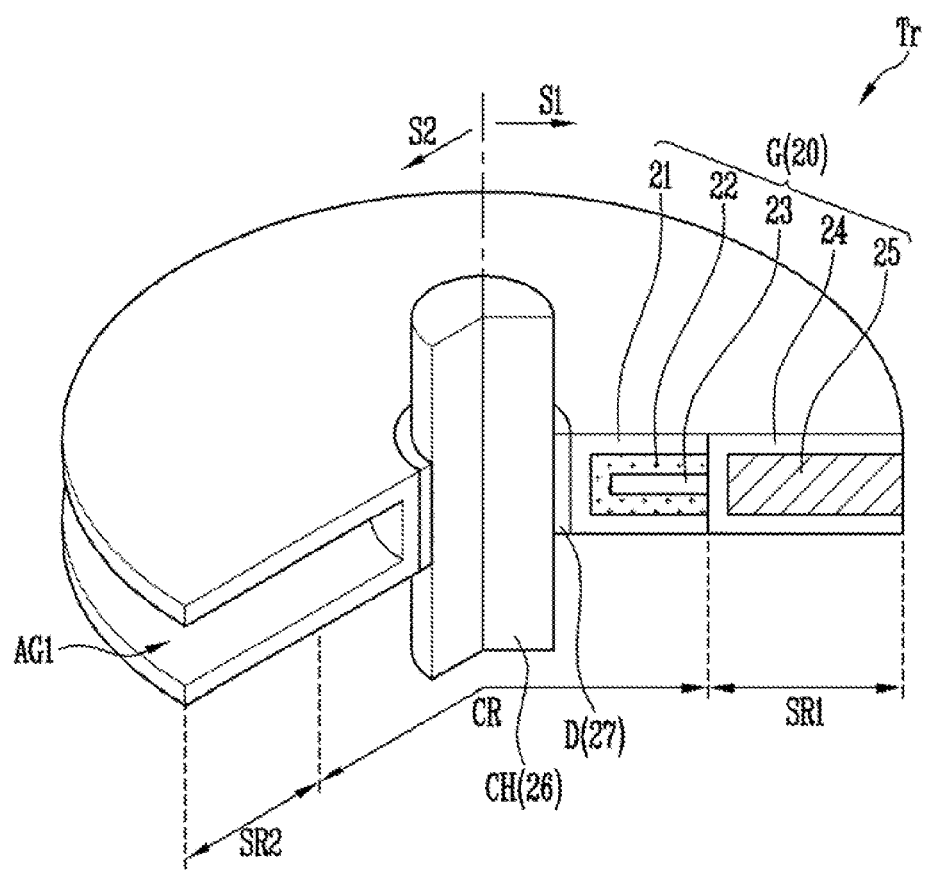

FIGS. 2A to 2C are views illustrating a structure of a semiconductor device according to an embodiment of the present invention. FIG. 2A is a perspective view of a conductive layer, FIG. 2B is a cross-sectional view taken along line A-A' of FIG. 2A, and FIG. 2C is a perspective view of a transistor. Hereinafter, repeated descriptions will be omitted.

As illustrated in FIGS. 2A and 2B, a conductive layer 20 of the semiconductor device according to an embodiment of the present invention includes a first barrier pattern 21, a material pattern 22, a second barrier pattern 23, a third barrier pattern 24, a conductive pattern 25, and an air gap AG1. The semiconductor device may further include a semiconductor pattern 26 and a dielectric layer 27 passing through the conductive layer 20.

The air gap AG1 may be an empty space located in a portion of a central region CR of the conductive layer 20. For example, the air gap AG1 is located in a core region C defined between the semiconductor patterns 26 within the central region CR. When the first barrier pattern 21 is formed using a deposition process, the first barrier pattern 21 is formed by flowing reactive gases through a cut portion such as a slit (not shown), etc. Therefore, before the first barrier pattern 21 is deposited on the core region C located in a farthest portion from a flowing path of the reactive gases (see arrows), a space between the semiconductor patterns 26 is fully filled with the first barrier pattern 21, and the flowing path of the reactive gases may be blocked. In this case, the reactive gases no longer flow into the core region C, and it remains an empty space. That is, the air gap AG1 is formed.

As illustrated in FIG. 2C, the transistor Tr includes a channel layer CH, a gate electrode G surrounding a sidewall of the channel layer CH, and a dielectric layer D interposed between the channel layer CH and the gate electrode G. The channel layer CH may be the above-described semiconductor pattern 26, the gate electrode G may be the above-described conductive layer 20, and the dielectric layer D may be the above-described dielectric layer 27.

The gate electrode G may have a structure in which one side S1 and the other side S2 with respect to the channel layer CH are different from each other. For example, the one side S1 of the gate electrode G includes the first barrier pattern 21, the material pattern 22 and the second barrier pattern 23 formed in the central region CR, and includes the third barrier pattern 24 and the conductive pattern 25 in a side region SR1. In the other side S2, the gate electrode G includes the first barrier pattern 21 and the air gap AG1 formed in the first barrier pattern 21 in both of the central region CR and a side region SR2.

Figure 3A:
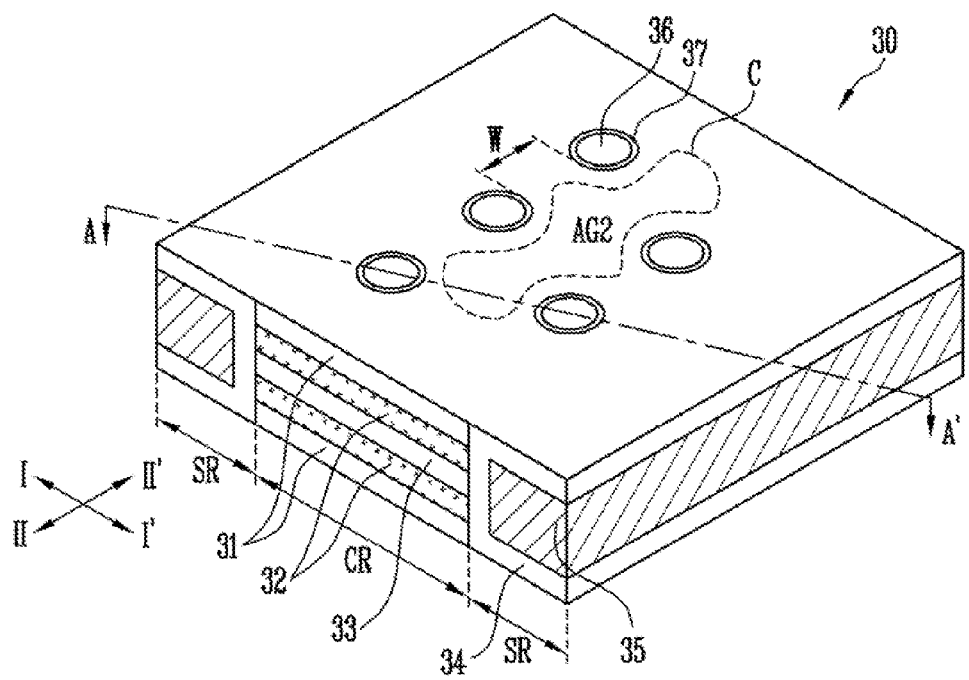
FIGS. 3A to 3C are views illustrating a structure of a semiconductor device according to an embodiment of the present invention.
Figure 3B:
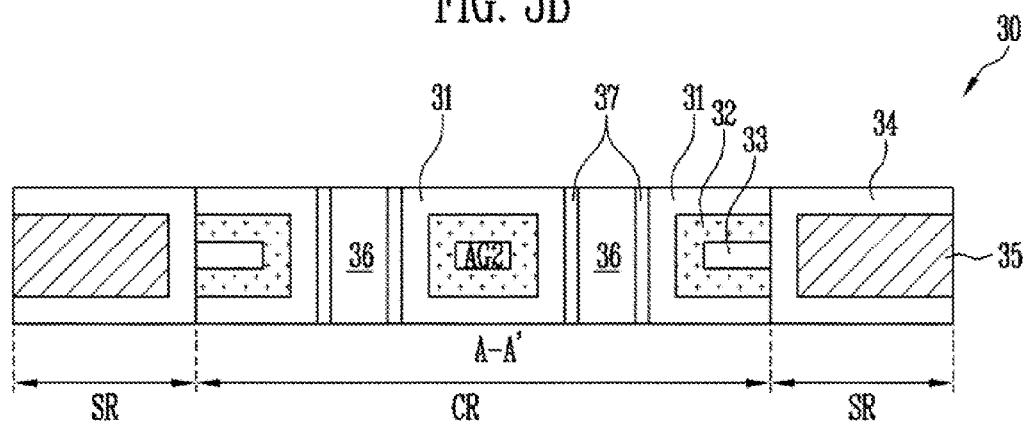
Figure 3C:
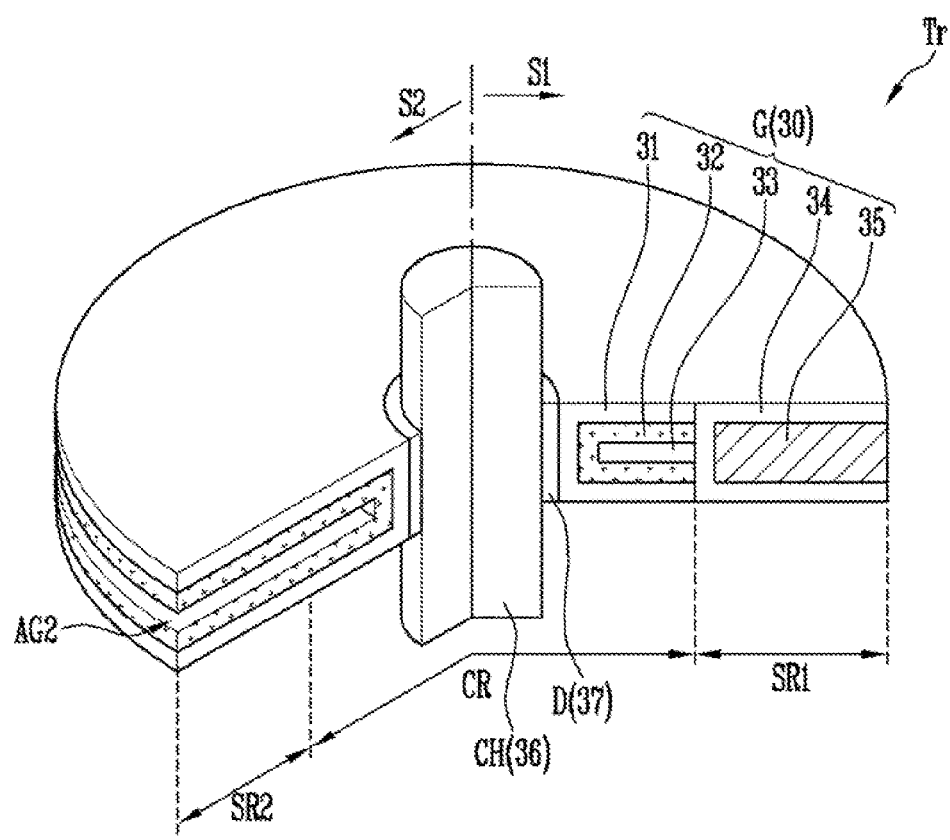

FIGS. 3A to 3C are views illustrating a structure of a semiconductor device according to an embodiment of the present invention. FIG. 3A is a perspective view of a conductive layer, FIG. 3B is a cross-sectional view taken along line A-A' of FIG. 3A, and FIG. 3C is a perspective view of a transistor. Hereinafter, repeated descriptions will be omitted.

As illustrated in FIGS. 3A and 3B, a conductive layer 30 of the semiconductor device according to an embodiment of the present invention includes a first barrier pattern 31, a material pattern 32, a second barrier pattern 33, a third barrier pattern 34, a conductive pattern 35, and an air gap AG2. The conductive layer 30 may further include a semiconductor pattern 36 and a dielectric layer 37.

The area of the air gap AG2 may be changed depending on a distance W between the semiconductor patterns 36. For example, in a deposition process of the material pattern 32 after forming the first barrier pattern 31, a space between the semiconductor patterns 36 is fully filled. In this case, the air gap AG2 is formed in the material pattern 32 of a core region C, and has a smaller area than that in the embodiment described with reference to FIGS. 2A to 2C.

As illustrated in FIG. 3C, the transistor Tr includes a channel layer CH, a gate electrode G surrounding a sidewall of the channel layer CH, and a dielectric layer D interposed between the channel layer CH and the gate electrode G. The channel layer CH may be the above-described semiconductor pattern 36, and the gate electrode G may be the above-described conductive layer 30, and the dielectric layer D may be the above-described dielectric layer 37.

The gate electrode G may have a structure in which one side S1 and the other side S2 with respect to the channel layer CH are different from each other. For example, the one side S1 of the gate electrode G includes the first barrier pattern 31, the material pattern 32 and the second barrier pattern 33 formed in a central region CR, and includes the third barrier pattern 34 and the conductive pattern 35 in a side region SR1. The other side S2 of the gate electrode G includes the first barrier pattern 31, the material pattern 32 in the first barrier pattern 31 and the air gap AG2 formed in the material pattern 32 in all of the central region CR and a side region SR2.

Figure 4:
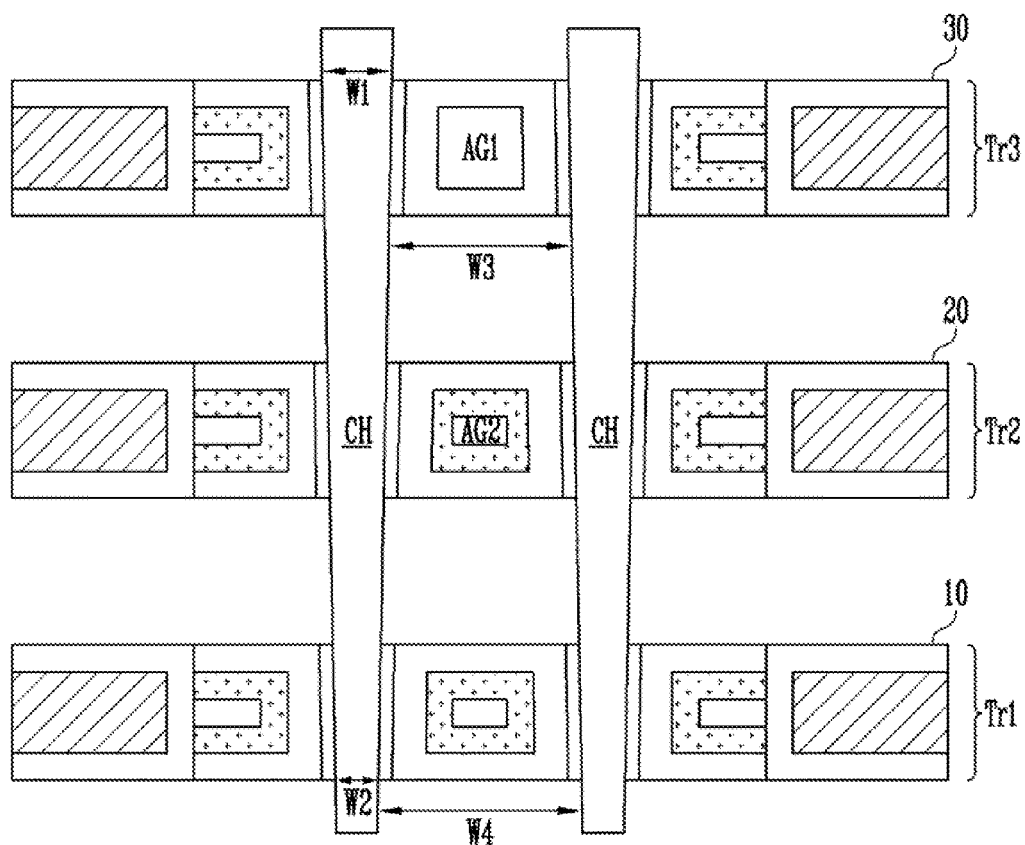
FIG. 4 is a cross-sectional view illustrating a structure of a semiconductor device according to an embodiment of the present invention.

FIG. 4 is a cross-sectional view showing a structure of a semiconductor device according to an embodiment of the present invention.

As illustrated in FIG. 4, the semiconductor device according to an embodiment of the present invention includes a plurality of transistors Tr1 to Tr3 stacked along a channel layer CH. The channel layer CH is formed in a shape having a large aspect ratio. Therefore, a width of the channel layer CH is decreased (W1>W2), and a distance between the channel layers CH is increased (W3<W4) toward a lower portion of the channel layer CH. Therefore, a gate electrode of the transistor Tr formed in an upper portion and a gate electrode of the transistor Tr formed in a lower portion may have different structures from each other.

For example, a first transistor Tr1 formed in a lowermost portion may have the structure described with reference to FIGS. 1A to 1C. A second transistor Tr2 formed on an upper portion of the first transistor Tr1 may have the structure described with reference to FIGS. 2A to 2C. Further, a third transistor Tr3 formed on an upper portion of the second transistor Tr2 may have the structure described with reference to FIGS. 3A to 3C. For reference, a stacking sequence of the first, second and third transistors Tr1 to Tr3 may be changed depending on the distance of the channel layers CH, the shape of the channel layers CH, deposition conditions, etc.

FIGS. 5A to 5F are cross-sectional views for describing a method of manufacturing a semiconductor device according to an embodiment of the present invention.

Figure 5A:
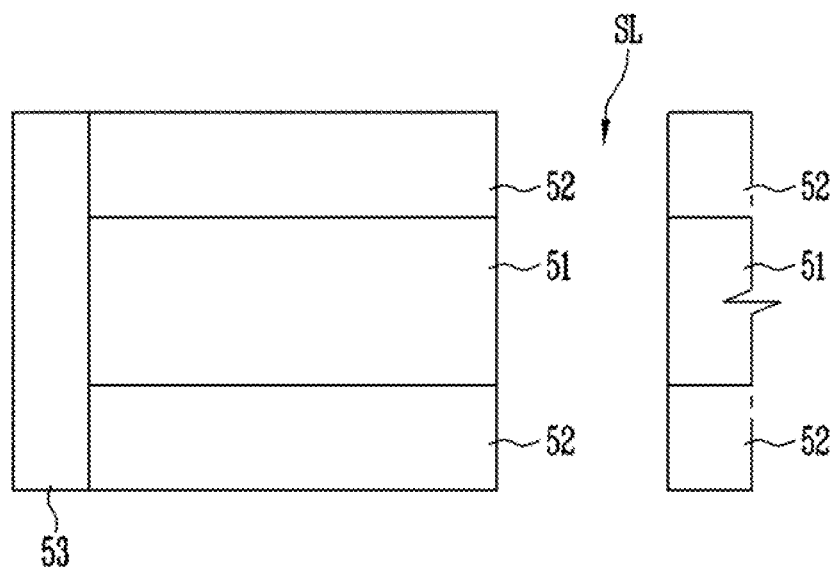
FIGS. 5A to 5F are cross-sectional views illustrating a method of manufacturing a semiconductor device according to an embodiment of the present invention.

As illustrated in FIG. 5A, a plurality of first material layers 51 and a plurality of second material layers 52 are alternately formed. The first material layers 51 may be provided to form gate electrodes of a select transistor, a memory cell transistor, etc., and the second material layers 52 may be provided to form an insulating layer in which the stacked gate electrodes are electrically separated.

The first material layers 51 may be formed of a material having a high etch selectivity with respect to the second material layers 52. As an example, the first material layers 51 may be formed of a sacrificial layer including a nitride, and the second material layers 52 may be formed of an insulating layer including an oxide. As another example, the first material layers 51 may be formed of a first sacrificial layer including a nitride, and the second material layers 52 may be formed of a second sacrificial layer including an oxide.

A semiconductor pattern 53 passing through the first and second material layers 51 and 52 is formed. For example, after forming a hole H passing through the first and second material layers 51 and 52, the semiconductor pattern 53 is formed in the hole H. The semiconductor pattern 53 may have a hollow center, a solid center, or a combination thereof. The hollow center may be filled with an insulating layer. Further, before forming the semiconductor pattern 53, a dielectric layer (not shown) may be formed in the hole H.

A slit SL passing through the first and second material layers 51 and 52 is formed. For example, the slit SL is formed to a depth to which the first material layers 51 are all exposed.

Figure 5B:
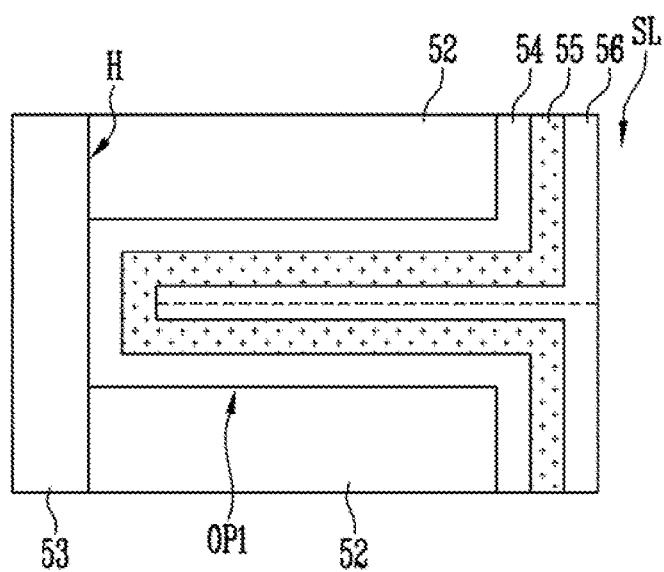

As illustrated in FIG. 5B, first openings OP1 are formed by removing the first material layers 51 exposed through the slit SL. A first barrier layer 54 is formed in the first openings OP1. The first barrier layer 54 may be formed along the first openings OP1 and an inner surface of the slit SL. For example, the first barrier layer 54 includes titanium nitride (TIN).

A material layer 55 having an etch selectivity with respect to the first barrier layer 54 is formed in the first openings OP1 in which the first barrier layer 54 is formed. The material layer 55 may be formed along the first openings OP1 and the inner surface of the slit SL. For example, the material layer 55 includes an oxide.

A second barrier layer 56 is formed in the first openings OP1 in which the material layer 55 is formed. The second barrier layer 56 may be formed along the first openings OP1 and the inner surface of the slit SL. Further, the second barrier layer 56 may be formed to a thickness in which the first openings OP1 are filled, and a seam (see dotted line) may be formed in the second barrier layer 56. For example, the second barrier layer 56 includes titanium nitride (TiN).

The first barrier layer 54, the material layer 55 and the second barrier layer 56 may be formed to the same thickness, or different thicknesses from one another. For example, the thicknesses of the first barrier layer 54, the material layer 55 and the second barrier layer 56 may be decided by considering a width of the first opening OP1, etching rates of each layer depending on the conditions of the following etching processes, a distance between the semiconductor patterns 53, etc.

For reference, although not shown in this drawing, an air gap may be formed in the first barrier layer 54, the material layer 55 or the second barrier layer 56 depending on the distance between the semiconductor patterns 53.

Figure 5C:
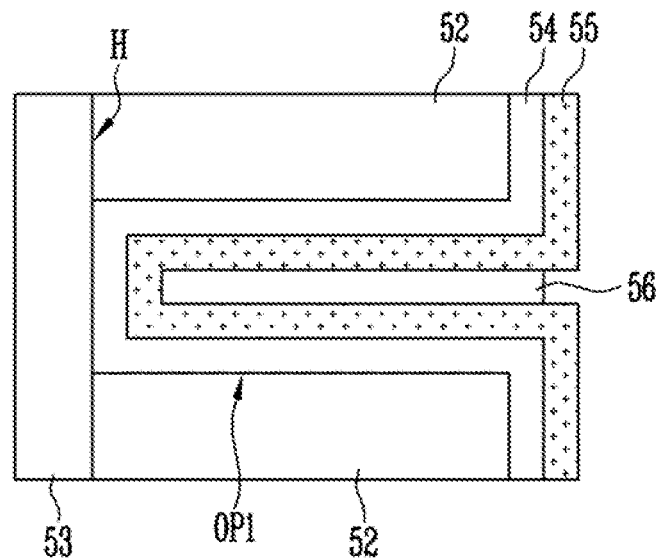

As illustrated in FIG. 5C, the second barrier layer 56 is partially etched to expose the material layer 55. For example, using a dry etching process, the second barrier layer 56 is selectively etched. When the dry etching process is used, even when the second barrier layer 56 includes the seam, a thickness with which the second barrier layer 56 is etched may be easily adjusted.

Figure 5D:
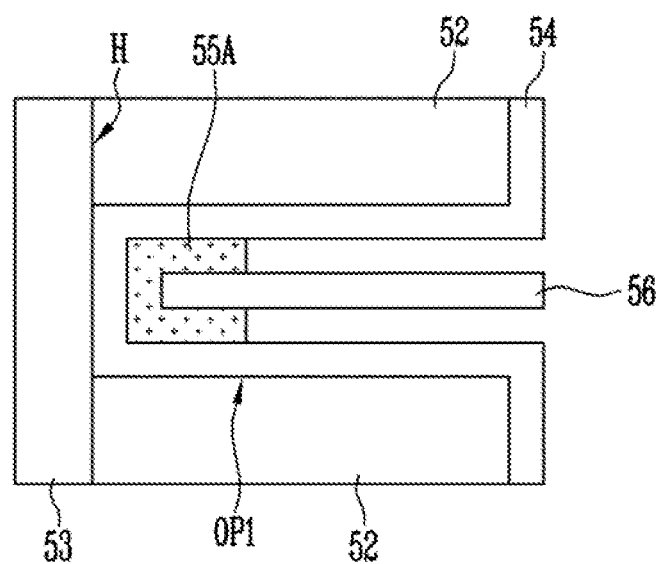

As illustrated in FIG. 5D, a material pattern 55A is formed by partially etching the exposed material layer 55. For example, the material layer 55 is selectively etched using a wet etching process.

Figure 5E:
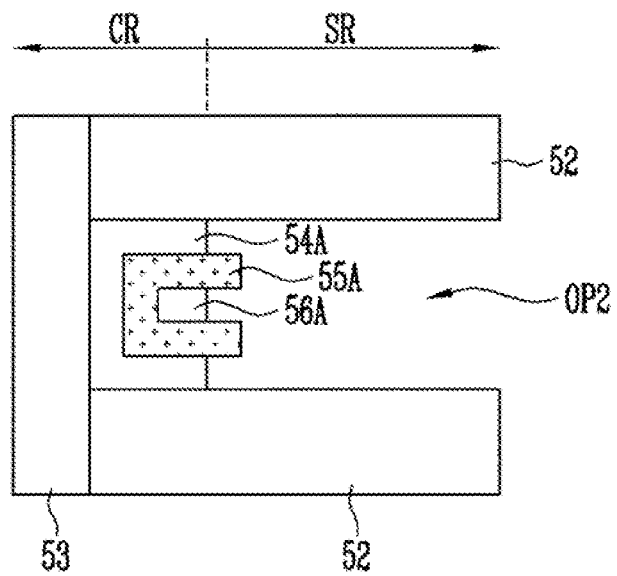

As illustrated in FIG. 5E, a first barrier pattern 54A and a second barrier pattern 56A are formed by partially etching the first barrier layer 54 and the second barrier layer 56. For example, the first and second barrier layers 54 and 56 are selectively etched using the dry etching process. The degree to which the first and second barrier layers 54 and 56 are etched may be adjusted according to the conditions of the etching process. For example, the first and second barrier layers 54 and 56 are etched such that the material pattern 55 protrudes from the first and second barrier layers 54 and 56.

Thus, a second opening OP2 is formed by removing the first barrier layer 54, the material layer 55 and the second barrier layer 56 formed in a side region SR of the first opening OP1. Further, the first barrier pattern 54A, the material pattern 55A and the second barrier pattern 56A are formed in a central region CR of the first opening OP1.

Figure 5F:
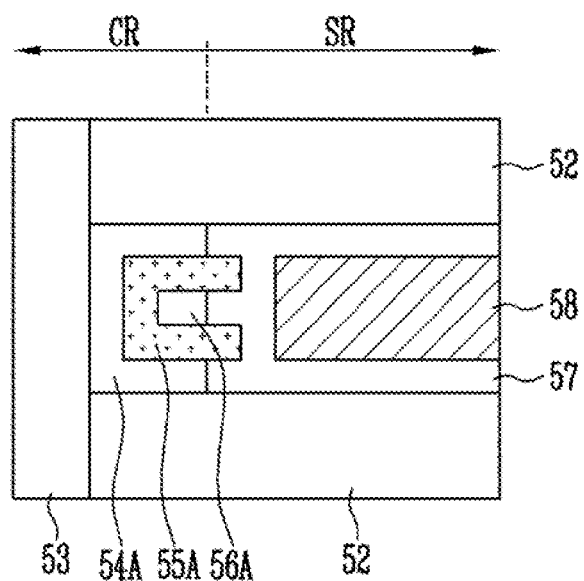

As illustrated in FIG. 5F, a conductive pattern 58 is formed in the second opening OP2. Before forming the conductive pattern 58, a third barrier pattern 57 may be formed in the second opening OP2. When the material pattern 55A protrudes from the first and second barrier patterns 54A and 56A, the third barrier pattern 57 is formed to surround a protruding area of the material pattern 55A. That is, a portion of the material pattern 55A may be embedded into the third barrier pattern 57 by protruding from the first barrier pattern 54A or the second barrier pattern 56A.

Thus, a conductive layer is formed in which the first barrier pattern 54A, the material pattern 55A and the second barrier pattern 56A are included in the central region CR, and the third barrier pattern 57 and the conductive pattern 58 are included in the side region SR.

For reference, although not shown in this drawing, when the first material layers 51 are first sacrificial layers and the second material layers 52 are second sacrificial layers, a process of replacing the second material layers 52 with insulating layers may be additionally performed. For example, after forming openings by removing the second material layers 52 through the slit SL, insulating layers are formed in the openings.

FIGS. 6A to 6E are cross-sectional views illustrating a method of manufacturing a semiconductor device according to an embodiment of the present invention. Hereinafter, repeated descriptions will be omitted.

Figure 6A:
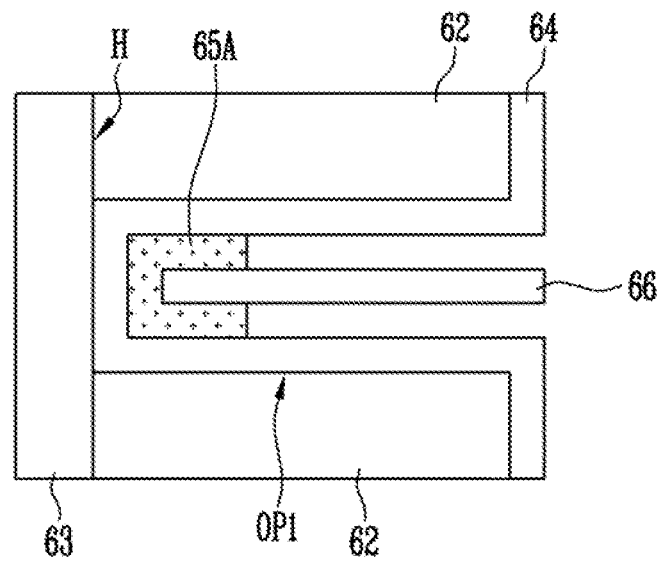
FIGS. 6A to 6E are cross-sectional views illustrating a method of manufacturing a semiconductor device according to an embodiment of the present invention.

As illustrated in FIG. 6A, a semiconductor pattern 63, second material layers 62 stacked to surround the semiconductor pattern 63, first openings OP1 defined between the stacked second material layers 62, and a first barrier layer 64, a material pattern 65A and a second barrier layer 66, which are located in the first openings OP1 are formed. For example, these intermediate results may be formed using the process described with reference to FIGS. 5A to 5D.

Figure 6B:
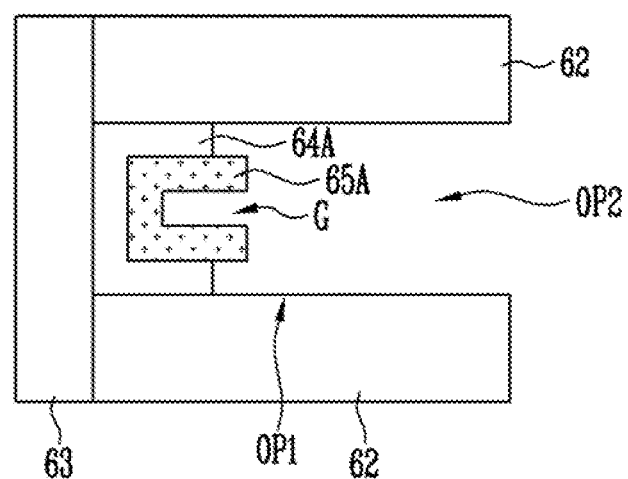

As illustrated in FIG. 6B, a second opening OP2 is formed by etching the first barrier layer 64 and the second barrier layer 66. The first barrier layer 64 and the second barrier layer 66 may be etched using the wet etching process, and etching rates of the first barrier layer 64 and the second barrier layer 66 may be the same or different from each other depending on materials and shapes of the first barrier layer 64 and the second barrier layer 66. For example, when a seam is included in the second barrier layer 66, since an etchant flows into the seam of the inside of the second barrier layer 66, the second barrier layer 66 may be etched at a higher rate than the first barrier layer 64. Therefore, the first barrier pattern 64A is formed in the first opening OP1, and the second barrier layer 66 may be entirely removed. Further, when the second barrier layer 66 is entirely removed, a groove G is formed inside the material pattern 65A.

Figure 6C:
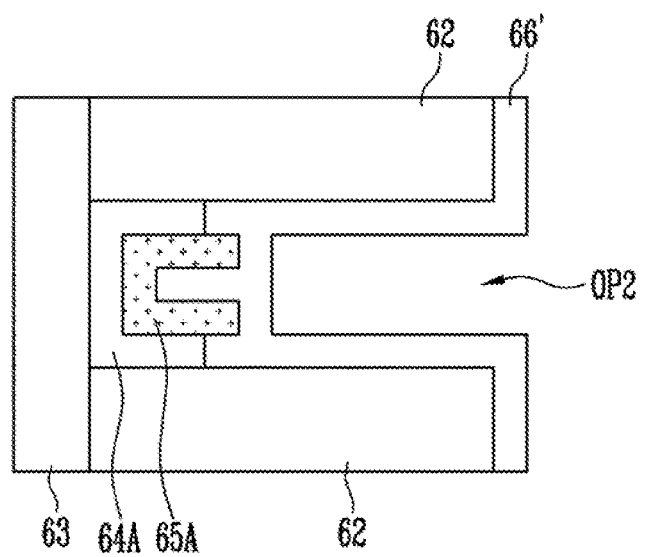

As illustrated in FIG. 6C, a third barrier layer 66' is formed in the second opening OP2 to fill the groove G in the material pattern 65A. The third barrier layer 66' may fill the groove G, and may be formed along an inner surface of the second opening OP2. The third barrier layer 66' may be formed of the same material as the second barrier layer 66.

Figure 6D:
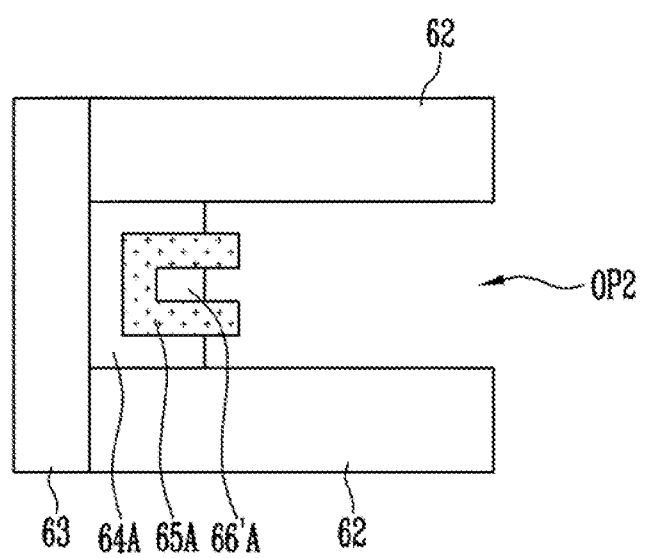

As illustrated in FIG. 6D, a third barrier pattern 66'A is formed by etching the third barrier layer 66'. For example, the third barrier layer 66' is etched using the dry etching process. In this case, the first barrier pattern 64A may also be partially etched.

Figure 6E:
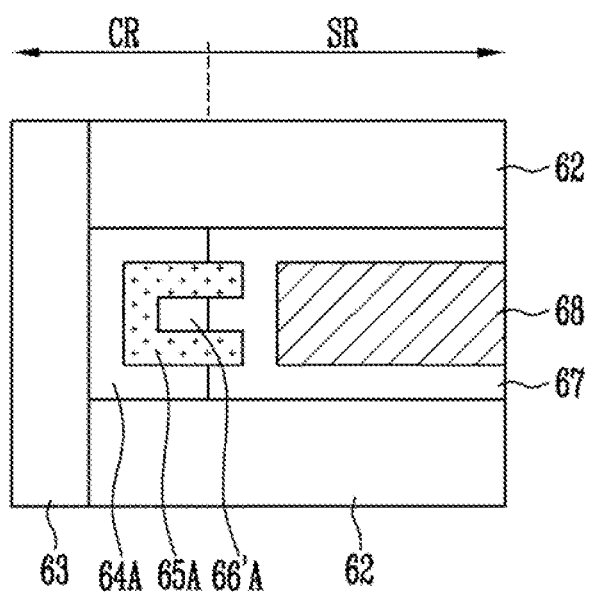

As illustrated in FIG. 6E, a fourth barrier pattern 67 and a conductive pattern 68 are formed in the second opening OP2. It is also possible to omit the fourth barrier pattern 67, and to form only the conductive pattern 68.

Thus, a conductive layer is formed in which the first barrier pattern 64A, the material pattern 65A and the third barrier pattern 66'A are included in a central region CR, and the fourth barrier pattern 67 and the conductive pattern 68 are included in a side region SR.

Figure 7A:
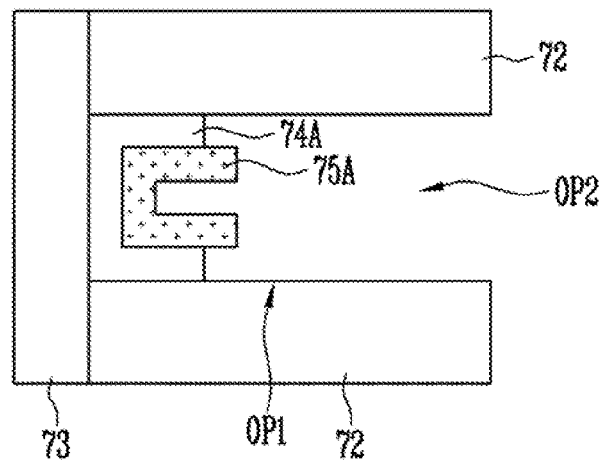
FIGS. 7A and 7B are cross-sectional views illustrating a method of manufacturing a semiconductor device according to an embodiment of the present invention.
Figure 7B:
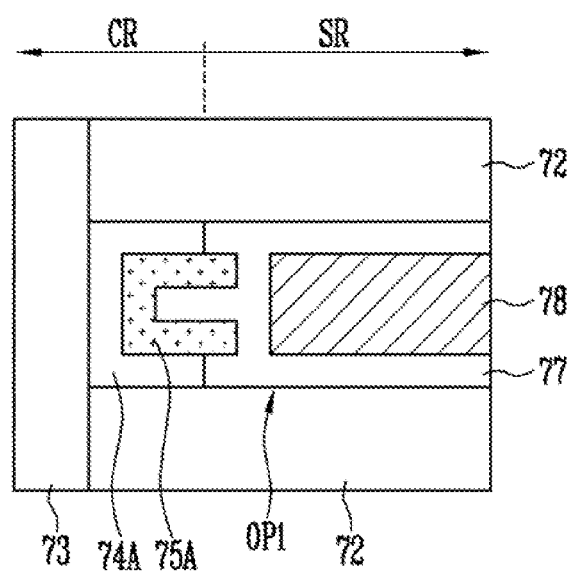

FIGS. 7A and 7B are cross-sectional views for illustrating a method of manufacturing a semiconductor device according to an embodiment of the present invention. Hereinafter, repeated descriptions will be omitted.

As illustrated in FIG. 7A, a semiconductor pattern 73, and second material layers 72, a first barrier pattern 74A, a material pattern 75A and a second opening OP2 stacked to surround the semiconductor pattern 73 are formed. For example, these intermediate results may be formed using the process described with reference to FIGS. 6A and 6B.

As illustrated in FIG. 7B, a third barrier pattern 77 is formed in the second opening OP2 to fill a groove of the material pattern 75A. A conductive pattern 78 is formed in the second opening OP2 in which the third barrier pattern 77 is formed. It is also possible to omit the third barrier pattern 77, and to form only the conductive pattern 78.

Thus, a conductive layer is formed in which the first barrier pattern 74A and the material pattern 75A are included in a central region CR, and the third barrier pattern 77 and the conductive pattern 78 are included in a side region SR.

Figure 8:
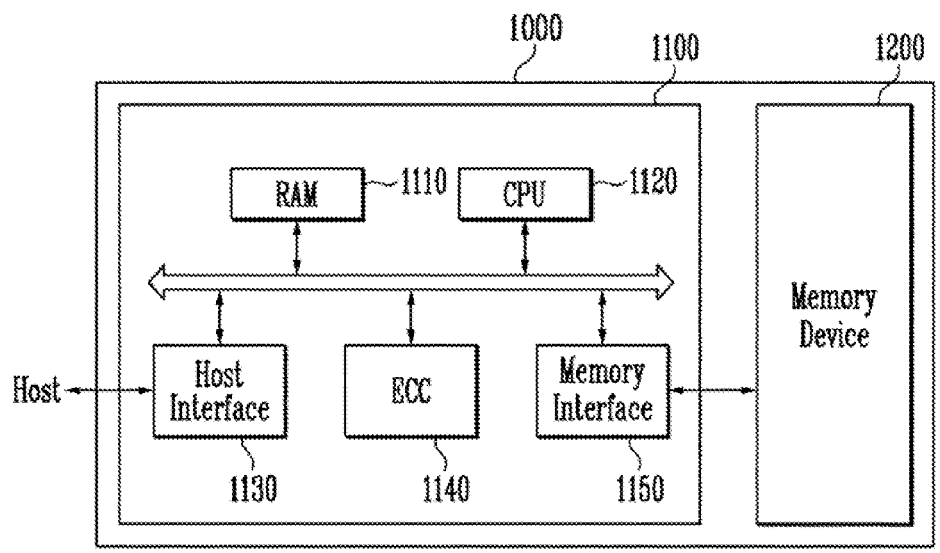
FIG. 8 is a block diagram illustrating a configuration of a memory system according to an embodiment of the present invention.

FIG. 8 is a block diagram illustrating a configuration of a memory system according to an embodiment of the present invention.

As illustrated in FIG. 8, a memory system 1000 according to the embodiment of the present invention includes a memory device 1200 and a controller 1100.

The memory device 1200 is used to store various types of data such as text, graphics, software code, etc. The memory device 1200 may be a nonvolatile memory, and may include the structure described with reference to FIGS. 1A to 7B. Further, the memory device 1200 is configured to define a central region and side regions located in both sides of the central region, and to include conductive layers including a first barrier pattern formed in the central region, a material pattern formed in the first barrier pattern and having an etch selectivity with respect to the first barrier pattern, and a second barrier pattern formed in the material pattern, and insulating layers alternately stacked with the conductive layers. Since a structure and a manufacturing method of the memory device 1200 are the same as described above, detailed descriptions will be omitted.

The controller 1100 is connected to a host and the memory device 1200, and is configured to access the memory device 1200 in response to a request from the host. For example, the controller 1100 is configured to control read, write, erase, and perform background operations of the memory device 1200.

The controller 1100 includes a random access memory (RAM) 1110, a central processing unit (CPU) 1120, a host interface 1130, an error correction code (ECC) circuit 1140, a memory interface 1150, etc.

The RAM 1110 may be used as an operation memory of the CPU 1120, a cache memory between the memory device 1200 and the host, a buffer memory between the memory device 1200 and the host, and so on. For reference, the RAM 1110 may be replaced with a static RAM (SRAM), a read only memory (ROM), etc.

The CPU 1120 is configured to control overall operations of the controller 1100. For example, the CPU 1120 is configured to operate firmware such as a Flash Translation Layer (FTL) stored in the RAM 1110.

The host interface 1130 is configured to perform interfacing with the host. For example, the controller 1100 communicates with the host through at least one of various interface protocols such as a Universal Serial Bus (USB) protocol, a MultiMediaCard (MMC) protocol, a Peripheral Component Interconnect (PCI) protocol, a PCI-Express (PCI-E) protocol, an Advanced Technology Attachment (ATA) protocol, a Serial-ATA protocol, a Parallel-ATA protocol, a Small Computer System Interface (SCSI) protocol, an Enhanced Small Disk Interface (ESDI) protocol, an Integrated Drive Electronics (IDE) protocol, a private protocol, and so on.

The ECC circuit 1140 is configured to detect and correct errors in data read from the memory device 1200 using the ECC.

The memory interface 1150 is configured to perform interfacing with the memory device 1200. For example, the memory interface 1150 includes a NAND interface or a NOR interface.

For reference, the controller 1100 may further include a buffer memory (not shown) in order to temporarily store data. The buffer memory may be used to temporarily store data delivered externally through the host interface 1130, or to temporarily store data delivered from the memory device 1200 through the memory interface 1150. The controller 1100 may further include a ROM to store code data for interfacing with the host.

According to an embodiment of the present invention, since the memory system 1000 includes the memory device 1200 having an improved degree of integration, the degree of integration of the memory system 1000 may also be improved.

Figure 9:
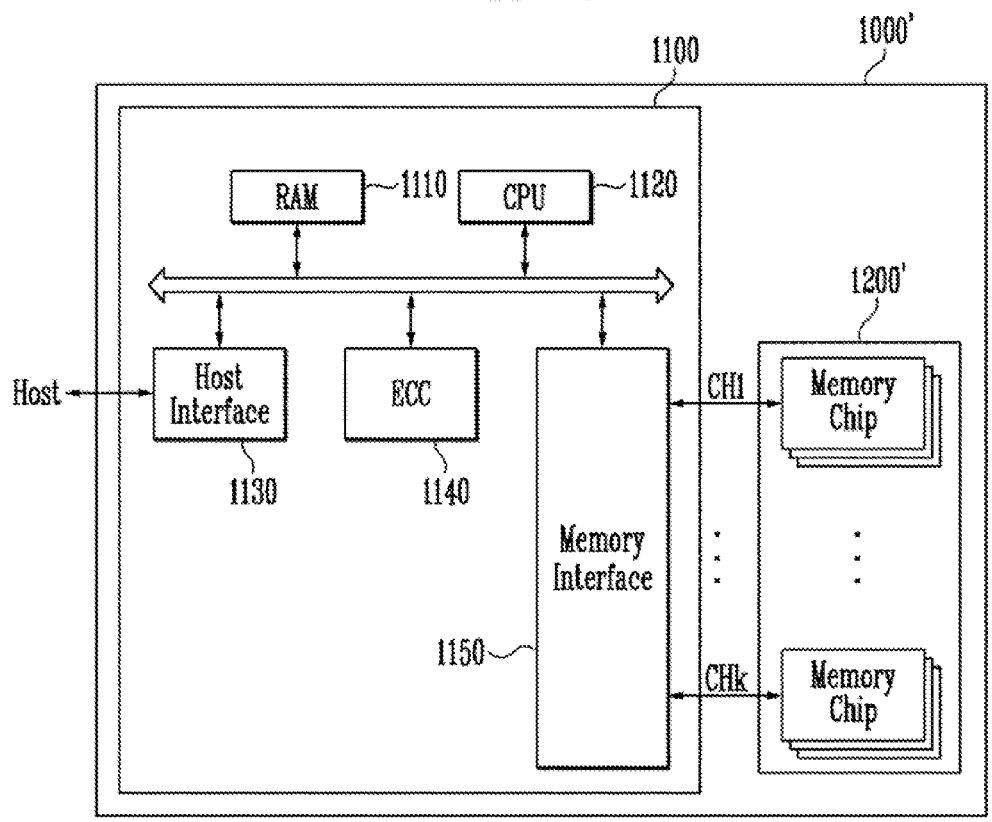
FIG. 9 is a block diagram illustrating a configuration of a memory system according to an embodiment of the present invention.

FIG. 9 is a block diagram illustrating a configuration of a memory system according to an embodiment of the present invention. Hereinafter, repeated descriptions will be omitted.

As illustrated in FIG. 9, a memory system 1000 according to the embodiment of the present invention includes a memory device 1200' and a controller 1100. Further, the controller 1100 includes a RAM 1110, a CPU 1120, a host interface 1130, an ECC circuit 1140, a memory interface 1150, and so on.

The memory device 1200' may be a nonvolatile memory, and may include the memory string described with reference to FIGS. 1A to 7B. Further, the memory device 1200' is configured to define a central region and side regions located in both sides of the central region, and to include conductive layers including a first barrier pattern formed in the central region, a material pattern formed in the first barrier pattern and having an etch selectivity with respect to the first barrier pattern, and a second barrier pattern formed in the material pattern, and insulating layers alternately stacked with the conductive layers. Since the structure and manufacturing method of the memory device 1200' are the same as described above, detailed descriptions will be omitted.

Further, the memory device 1200' may be a multi-chip package configured of a plurality of the memory chips. The plurality of memory chips are divided into a plurality of groups, and the plurality of groups are configured to communicate with the controller 1100 through first to kth channels CH1 to CHk. The memory chips belonging to one group are configured to communicate with the controller 1100 through a common channel. For reference, the memory system 1000' may be transformed to connect one channel to one memory chip.

According to the embodiment of the present invention, since the memory system 1000' includes the memory device 1200' having an improved degree of integration, the degree of integration of the memory system 1000' may also be improved. Particularly, by configuring the memory device 1200' as a multi-chip package, data storage capacity of the memory system 1000' may be increased and driving speed may be improved.

Figure 10:
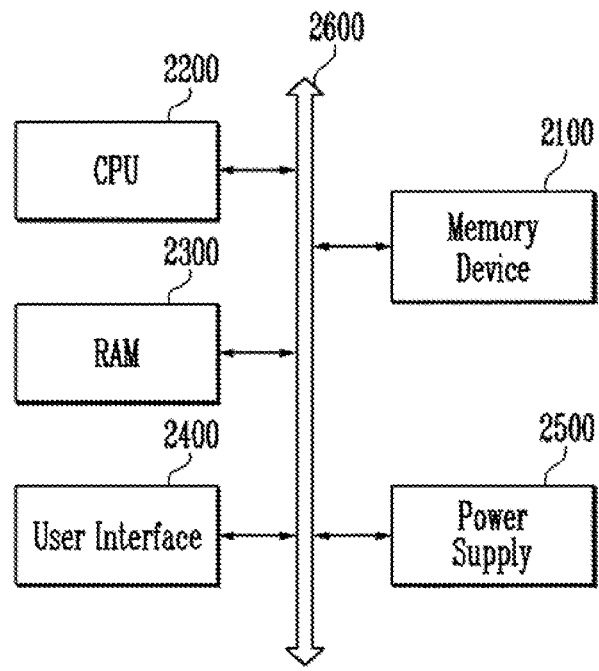
FIG. 10 is a block diagram illustrating a configuration of a computing system according to an embodiment of the present invention.

FIG. 10 is a block diagram showing a configuration of a computing system according to an embodiment of the present invention. Hereinafter, the repeated descriptions will be omitted.

As illustrated in FIG. 10, according to the embodiment of the present invention, a computer system 2000 includes a memory device 2100, a CPU 2200, a RAM 2300, a user interface 2400, a power supply 2500, a system bus 2600, and so on.

The memory device 2100 stores data provided through the user interface 2400, data processed by the CPU 2200, etc. The memory device 2100 is electrically connected to the CPU 2200, the RAM 2300, the user interface 2400, the power supply 2500, and so on through the system bus 2600. For example, the memory device 2100 may be connected to the system bus 2600 through a controller (not shown) or may be directly connected to the system bus 2600. When the memory device 2100 is directly connected to the system bus 2600, a function of the controller may be performed by the CPU 2200, the RAM 2300, and so on.

The memory device 2100 may be a nonvolatile memory, and may include the memory string described with reference to FIGS. 1A to 7B. Further, the memory device 2100 is configured to define a central region and side regions located in both sides of the central region, and to include conductive layers including a first barrier pattern formed in the central region, a material pattern formed in the first barrier pattern and having an etch selectivity with respect to the first barrier pattern, and a second barrier pattern formed in the material pattern, and insulating layers alternately stacked with the conductive layers. Since the structure and manufacturing method of the memory device 2100 are the same as described above, detailed descriptions will be omitted.

Further, the memory device 2100 may be a multi-chip package having a plurality of the memory chips as described with reference to FIG. 9.

The computer system 2000 having such a configuration may be a computer, an ultra mobile PC (UMPC), a workstation, a net-book, a personal digital assistant (PDA), a portable computer, a web tablet, a wireless phone, a mobile phone, a smartphone, an e-book, a portable multimedia player (PMP), a portable game console, a navigation device, a black box, a digital camera, a 3-dimensional television, a digital audio recorder, a digital audio player, a digital picture recorder, a digital picture player, a digital video recorder, a digital video player, a device for wirelessly sending and receiving information, at least one of various electronic devices configuring a home network, at least one of various electronic devices configuring a computer network, at least one of various electronic devices configuring a telematics network, an RFID device, etc.

According to the embodiment of the present invention, since the memory system 2000 includes the memory device 2100 having an improved degree of integration, data storage capacity of the memory system 2000 may be improved.

Figure 11:
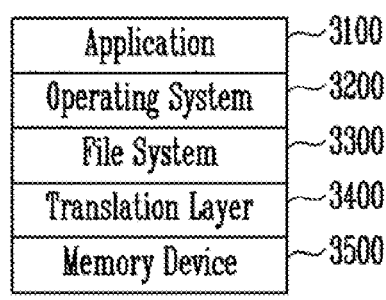
FIG. 11 is a block diagram illustrating a computing system according to an embodiment of the present invention.

FIG. 11 is a block diagram showing a computing system according to an embodiment of the present invention.

As illustrated in FIG. 11, according to the embodiment of the present invention, a computing system 3000 includes a software layer having an operating system 3200, an application 3100, a file system 3300, a translation layer 3400, etc. Further, the computing system 3000 includes a hardware layer such as a memory device 3500, etc.

The operating system 3200 manages software resources and hardware resources of the computing system 3000, and may control program execution by the CPU. The application 3100 may be various application programs executed in the computing system 3000, and may be a utility executed by the operating system 3200.

The file system 3300 is a logical structure to manage data, files, etc., in the computer system 3000 that organizes files or data stored in the memory device 3500 according to rules. The file system 3300 may be determined by the operating system 3200 used in the computer system 3000. For example, when the operating system 3200 is Microsoft Windows, the file system 3300 may be File Allocation Table (FAT), NT File System (NTFS), etc. Further, when the operating system 3200 is Unix/Linux, the file system 3300 may be the extended file system (ext), the Unix file system (UFS), a journaling file system, etc.

In FIG. 11, the operating system 3200, the application 3100 and a file system 3300 are shown as separate blocks, but the application 3100 and the file system 3300 may be included in the operating system 3200.

A translation layer 3400 translates an address into an appropriate type for the memory device 3500 in response to a request from the file system 3300. For example, the translation layer 3400 translates a logical address created by the file system 3300 into a physical address of the memory device 3500. Mapping information of the logical address and the physical address may be stored in an address translation table. For example, the translation layer 3400 may be an FTL, a Universal Flash Storage link layer (ULL), etc.

The memory device 3500 may be a nonvolatile memory, and may include the memory string described with reference to FIGS. 1A to 7B. Further, the memory device 3500 is configured to define a central region and side regions located in both sides of the central region, and to include conductive layers including a first barrier pattern formed in the central region, a material pattern formed in the first barrier pattern and having an etch selectivity with respect to the first barrier pattern, and a second barrier pattern formed in the material pattern, and insulating layers alternately stacked with the conductive layers. Since the structure and manufacturing method of the memory device 3500 are the same as described above, detailed descriptions will be omitted.

The computer system 3000 having this configuration may be separated by an operating system layer implemented in the upper level region and a controller layer implemented in the lower level region. The application 3100, the operating system 3200 and the file system 3300 may be included in the operating system layer, and may be driven by an operating memory of the computer system 3000. The translation layer 3400 may be included in the operating system layer or in the controller layer.

According to the embodiment of the present invention, since the computing system 3000 includes the memory device 3500 having an improved degree of integration, data storage capacity of the computing system 3000 may be improved.

According to an embodiment of the present invention, the degree of difficulty in manufacturing a transistor and a semiconductor device may be lowered, and damage to surrounding layers in the manufacturing process thereof may be prevented. Therefore, the characteristics of the transistor and the semiconductor device may be enhanced.

While the invention has been described in detail through detailed embodiments, it should be noted that the above-described embodiments are to be used merely for descriptive purposes and are not limitations on the invention. It should be understood by those skilled in the art that various changes, substitutions and alterations may be made without departing from the scope of the invention as defined by the following claims.

What is claimed is:

1. A method of manufacturing a semiconductor device, comprising:
   alternately forming first material layers and second material layers;
   forming a slit passing through the first material layers and the second material layers;
   forming first openings by removing the first material layers through the slit;
   forming a first barrier layer in the first openings;
   forming a material layer having an etch selectivity with respect to the first barrier layer in the first openings in which the first barrier layer is formed;
   forming a second barrier layer in the first openings in which the material layer is formed;
   forming second openings by removing the first barrier layer, the material layer and the second barrier layer formed in side regions of the first openings through the slit; and
   forming conductive patterns in the second openings.

2. The method of claim 1, further comprising:
   forming third barrier patterns in the second openings before forming the conductive patterns.

3. The method of claim 1, wherein the forming of the second openings includes:
   partially etching the second barrier layer to expose the material layer;
   forming a material pattern by partially etching the exposed material layer; and
   forming a first barrier pattern surrounding the material pattern, and a second barrier pattern located in the material pattern by partially etching the first barrier layer and the second barrier layer.

4. The method of claim 3, wherein the forming of the first barrier pattern and the second barrier pattern includes partially etching the first barrier layer and the second barrier layer using a dry etching process.

5. The method of claim 3, wherein the forming of the first barrier pattern and the second barrier pattern includes:
   forming the first barrier pattern and a groove in the material pattern by etching the second barrier layer and a portion of the first barrier layer using a wet etching process;
   forming a fourth barrier layer in the second opening to fill the groove; and
   forming a fourth barrier pattern in the groove by dry etching the fourth barrier layer.

6. The method of claim 3, wherein the forming of the first barrier pattern and the second barrier pattern includes forming the first barrier pattern and a groove in the material pattern by etching the second barrier layer and a portion of the first barrier layer using a wet etching process.

7. The method of claim 6, further comprising:
   forming a third barrier layer filling the groove and surrounding the conductive pattern before forming the conductive patterns.

* * * * *